United States Patent
Yamada et al.

(10) Patent No.: US 6,602,435 B1
(45) Date of Patent: Aug. 5, 2003

(54) ETCHING METHOD

(75) Inventors: Masahiro Yamada, Kawasaki (JP); Youbun Ito, Yamanashi (JP); Kouichiro Inazawa, Tokyo (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/582,457

(22) PCT Filed: Dec. 25, 1998

(86) PCT No.: PCT/JP98/05895
§ 371 (c)(1), (2), (4) Date: Jun. 26, 2000

(87) PCT Pub. No.: WO99/34419
PCT Pub. Date: Jul. 8, 1999

(30) Foreign Application Priority Data

Dec. 27, 1997 (JP) .............................................. 9-368081
Nov. 2, 1998 (JP) .......................................... 10-327507

(51) Int. Cl.⁷ ......................................... H01L 21/3065
(52) U.S. Cl. ............................. 216/67; 216/79; 216/80; 438/715; 438/723; 438/724
(58) Field of Search .............................. 216/67, 79, 80; 438/715, 723, 724

(56) References Cited

U.S. PATENT DOCUMENTS

| | | | | |
|---|---|---|---|---|
| 4,431,477 A | * | 2/1984 | Zajac | 156/643 |
| 5,338,399 A | * | 8/1994 | Yanagida | 156/662 |
| 5,770,098 A | * | 6/1998 | Araki et al. | 216/67 |
| 6,069,092 A | * | 5/2000 | Imai et al. | 438/723 |
| 6,136,643 A | * | 10/2000 | Jeng et al. | 438/253 |
| 6,159,862 A | * | 12/2000 | Yamada et al. | 438/712 |
| 6,232,209 B1 | * | 5/2001 | Fujiwara et al. | 438/585 |
| 6,242,359 B1 | * | 6/2001 | Misra | 438/710 |

FOREIGN PATENT DOCUMENTS

| | | | |
|---|---|---|---|
| JP | 4-258117 | 9/1992 | |
| JP | 10-189553 | 7/1998 | |
| JP | 10-199865 | 7/1998 | |
| JP | 11-186229 | * 9/1999 | H01L/21/3065 |

* cited by examiner

Primary Examiner—Richard Bueker
Assistant Examiner—Allan Olsen
(74) Attorney, Agent, or Firm—Finnegan Henderson Farabow Garrett & Dunner, L.L.P.

(57) ABSTRACT

A processing gas constituted of $C_5F_8$, $O_2$ and Ar achieving a flow rate ratio of $1 \leq C_5F_8$ flow rate/$O_2$ flow rate $\leq 1.625$ is supplied into a processing chamber 102 of an etching apparatus 100 and the atmosphere pressure is set within a range of 45 mTorr~50 mTorr. High-frequency power is applied to a lower electrode 110 sustained within a temperature range of 20° C.~40° C. on which a wafer W is mounted to raise the processing gas to plasma, and using the plasma, a contact hole 210 is formed at an $SiO_2$ film 208 on an SiNx film 206 formed at the wafer W. The use of $C_5F_8$ and $O_2$ makes it possible to form a contact hole 210 achieving near-perfect verticality at the $SiO_2$ film 208 and also improves the selection ratio of the SiO2 film 208 relative to the SiNx film 206. $C_5F_8$, which becomes decomposed over a short period of time when released into the atmosphere, does not induce the greenhouse effect.

10 Claims, 4 Drawing Sheets

ETCHING METHOD

TECHNICAL FIELD

The present invention relates to an etching method.

BACKGROUND ART

To keep pace with the great improvements made with respect to the degree of integration of semiconductor devices in recent years, miniaturization of various elements formed on semiconductor substrates has become one of the crucial technical requirements. In order to meet this requirement, the distance between the individual gates (electrodes) formed on a semiconductor substrate must be reduced. If contact holes are formed between the gates, the contact holes, too, be miniaturized. However, as the distances between the gates become increasingly small, the difficulty in forming even smaller contact holes at accurate positions increases, due to the limits of the alignment performance of the stepper and the like. Accordingly, a self-aligning contact technology, whereby self-aligned contact holes are formed within the minute space between individual gates by forming a protective film (base) constituted of, for instance, an SiNx film (silicon nitride film) at the surfaces of the gates and thereby preventing the gates from becoming etched during the contact hole formation, has been proposed of late.

For the etching process implemented to form the contact holes and, more specifically, during the etching process implemented to form contact holes passing through the insulating film covering the individual gates and constituted of, for instance, an $SiO_2$ film (silicon oxide film) between the gates, a mixed gas constituted by adding CO to $C_4F_8$, for instance, is used as the processing gas. gas constituted by adding CO to $C_4F_8$ provides advantages in that an almost vertical etching shape is achieved and in that the selection ratio of the $SiO_2$ film to the SiNx film ($SiO_2$ film etching rate /SiNx film etching rate) (hereafter referred to as the "selection ratio") is improved.

However, if $C_4F_8$, which is not readily degraded in the atmosphere, is directly released into the atmosphere without having been dissociated during the processing, it becomes a greenhouse effect inducing gas to hasten the process of global warming.

For instance, it has been reported that the life of $C_4F_8$ in the atmosphere is 3200 years (Climate Change 1995, the Current Status and Measures Taken with Respect to the PFC Problem At Semiconductor Mass Producing Plants), whereas the life of $C_5F_8$ in the atmosphere is only one year.

DISCLOSURE OF THE INVENTION

An object of the present invention, which has been completed by addressing the problems of the prior art discussed above, is to provide a new and improved etching method that allows an etching process to be implemented using a gas that becomes degraded in a relatively short period of time when it is released into the atmosphere and does not induce the greenhouse effect while achieving vertical etching of an $SiO_2$ film and a selection ratio which are comparable to or better than those in the prior art.

In order to achieve the object described above, in the etching method according to the present invention, in which an $SiO_2$ film formed on a workpiece placed within an airtight processing chamber is etched by raising a processing gas induced into the processing chamber to plasma, the processing gas contains at least $C_5F_8$ and $O_2$.

It has been confirmed that $C_5F_8$ constituting the processing gas according to the present invention becomes degraded in a relatively short period of time in the atmosphere compared to the CF gases that are used as processing gases in the prior art such as $CF_4$, $C_2F_6$ and $C_4F_8$. Thus, the use of $C_5F_8$, which does not induce the greenhouse effect even when it is directly released into the atmosphere, will contribute toward prevention of global warming.

In addition, since $C_5F_8$ is relatively rich in carbon compared to the CF gases such as $CF_4$, $C_2F_6$ and $C_4F_8$ mentioned above, a carbon containing film that is to constitute a protective film can be formed with ease at the etching mask, at the shoulders of the etching mask pattern or at the inner side walls of the contact holes. However, if $C_5F_8$ alone or a mixed gas constituted of $C_5F_8$ and Ar is used for the etching process, the carbon-containing film remains at the bottoms of the contact holes to result in a so-called etch stop. Accordingly, the processing gas according to the present invention contains $O_2$ so that the quantity of carbon-containing film within the contact holes can be controlled through the $O_2$ to prevent the occurrence of an etch stop and to achieve control of the contact hole angle. As a result, compared to the prior art, which uses a gas containing $C_4F_8$ and CO for the etching process, the contact holes achieving an equal or higher degree of verticality can be formed.

Furthermore, forming an $SiO_2$ film over an SiNx film formed on the workpiece prevents etching of the exposed surface of the SiNx film by the carbon-containing film covering the exposed surface to achieve an improvement in the selection ratio.

Also, by setting the flow rate ratio of $C_5F_8$ and $O_2$ within the range of $1 \leq (C_5F_8$ flow rate/$O_2$ flow rate$) \leq 1.5$, a high selection ratio comparable to or better than the selection ratios achieved when using the processing gases in the prior art mentioned above is achieved.

Moreover, a nearly vertical etching shape can be obtained by, for instance, setting the flow rate ratio of $C_5F_8$ and $O_2$ within the range of $1.3 \leq (C_5F_8$ flow rate/$O_2$ flow rate$) \leq 1.625$, by setting the atmosphere pressure within the processing chamber to 45 mTorr~50 mTorr, by setting the temperature of the stage on which the workpiece is mounted within the range of 20° C.~40° C. or by adding an inert gas such as Ar to the processing gas.

BEST MODE FOR CARRYING OUT THE INVENTION

The following is an explanation of the preferred embodiments of the etching method according to the present invention, given in reference to the attached drawings.

Figure 1:
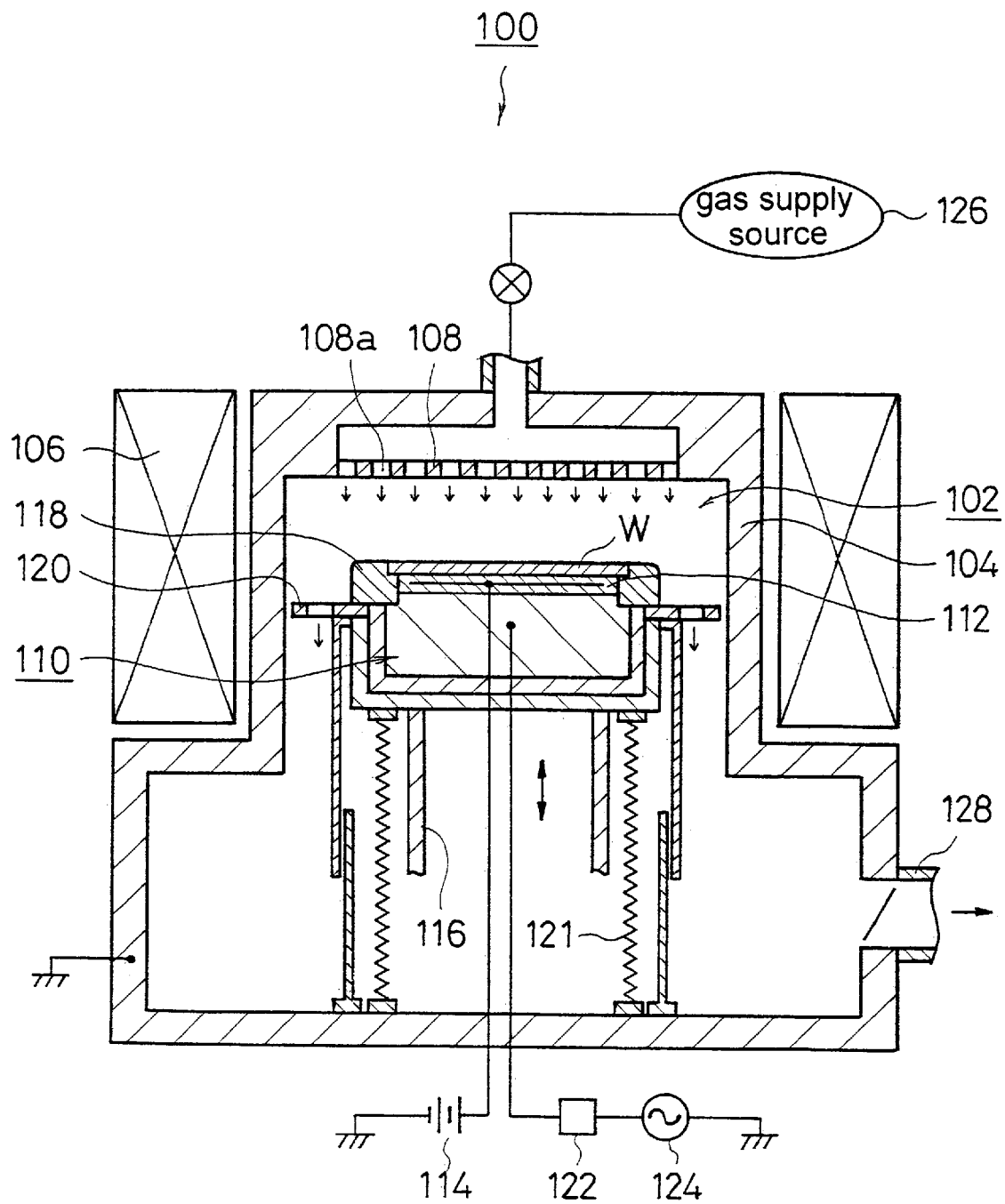
FIG. 1 is a schematic sectional view of an etching apparatus that may adopt the present invention.

First, the structure of an etching apparatus in which the etching method according to the present invention may be adopted and is explained in reference to FIG. 1.

A processing chamber 102 of an etching apparatus 100 is formed within an airtight conductive processing container 104. In addition, a magnet 106 capable of generating a rotating magnetic field in the plasma area formed within the processing chamber 102 surrounds the processing container 104. Inside the processing chamber 102, an upper electrode 108 constituting the ceiling of the processing chamber 102 and a lower electrode 110 facing opposite the upper electrode 108 and constituting a susceptor are formed.

An electrostatic chuck 112, to which a high-voltage DC source 114 is connected is provided on the lower electrode 110. A workpiece such as a semiconductor wafer (hereafter referred to as a "wafer") W can be a vacuum-held onto the mounting surface on the electrostatic chuck 112. In addition, an elevator mechanism (not shown) is connected to the lower electrode 110 via an elevator shaft 116 to allow the lower electrode 110 to move freely along the vertical direction. A focus ring 118 constituted of an insulating material is provided to cover the side surface of the lower electrode 110. A baffle plate 120 having a plurality of through holes formed therein is attached to the side surface of the focus ring 118. The baffle plate 120 is constituted of a conductive material and is grounded via a conductive bellows 121 and the processing container 104. The lower electrode 110 is also connected with a high-frequency source 124 capable of outputting a specific level of high-frequency power for plasma generation via a matching device 122.

The upper electrode 108 having formed therein numerous through holes 108a communicating between the space inside the processing chamber 102 and a gas supply source 126 achieves a showerhead structure. By assuming this structure, the processing gas in this embodiment, e.g., a mixed gas constituted of $C_5F_8$, $O_2$ and Ar is discharged evenly via the through holes 108a along the direction in which the wafer W extends inside the processing chamber 102 from the gas supply source 126.

In addition, the atmosphere inside the processing chamber 102 is discharged from a discharge pipe 128 via the baffle plate 120. The atmosphere pressure inside the processing chamber 102 is set as appropriate by adjusting the quantity of the processing gas described above supplied into the processing chamber 102 and the quantity of the atmosphere within the processing chamber 102 that is discharged from the processing chamber 102.

Next, a method of forming contact holes in the minute space between the individual gates formed on the wafer W by implementing an etching process on the wafer W with the etching apparatus 100 described above is explained.

Figure 2:
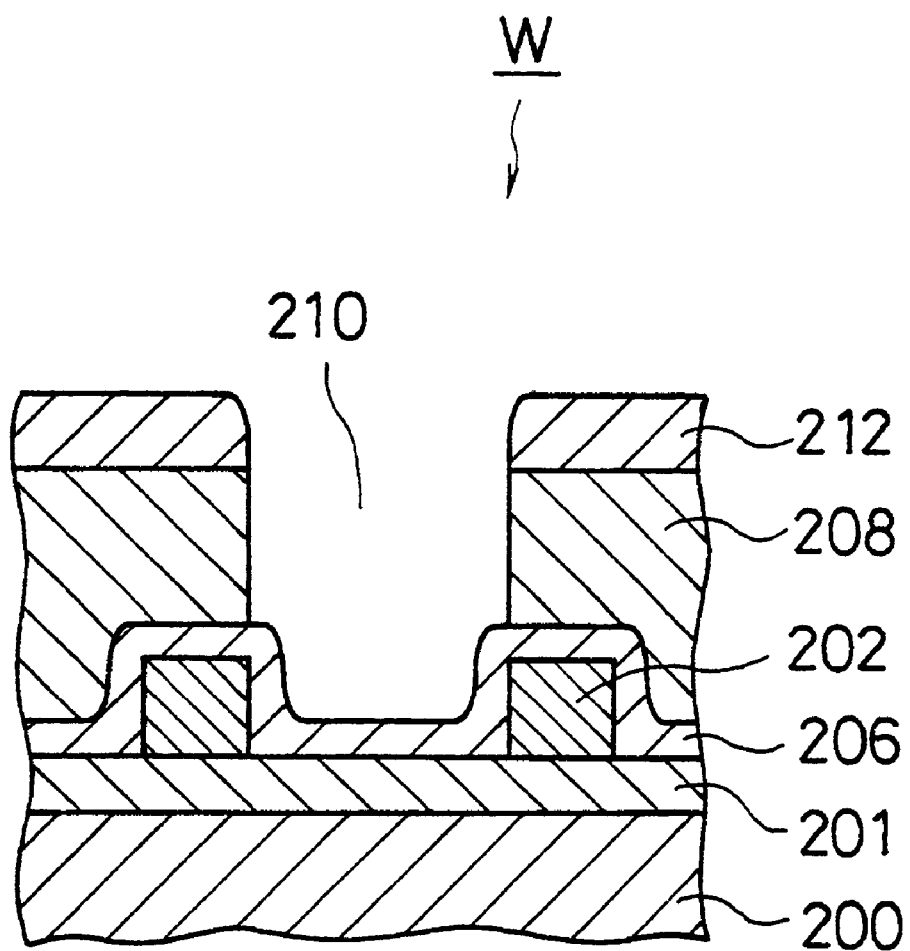
FIG. 2 is a schematic sectional view in an enlargement, illustrating a wafer processed by using the etching apparatus shown in FIG. 1.

First, in reference to FIG. 2, the wafer W to be processed is explained. Gates 202 are formed via an $SiO_2$ film 201 on an Si (silicon) substrate 200 constituting the wafer W, and an SiNx film 206 is formed to cover the gates 202. The SiNx film 206 prevents the gates 202 from becoming etched during the formation of contact holes 210 which is to be detailed later so that self-aligned contact holes 210 are formed between the gates 202. In addition, a silicon type oxide film constituting an insulating film, e.g., an $SiO_2$ film 208, is formed on the SiNx film 206. It is to be noted that an insulating film constituted of BPSG (silicate glass constituted of boron and phosphorous), PSG (silicate glass constituted of phosphorus), TEOS (tetra-ethoxy orthosilane), Th-OX (thermal oxide) or SOG (spin on glass), may be formed instead of the $SiO_2$ film 208.

Next, the process implemented to form the contact holes 210 between the gates 202 at the wafer W mentioned above is explained in reference to FIGS. 1 and 2.

First, after mounting the wafer. W on the lower electrode 110 with its temperature maintained at 20° C.~40° C., the processing gas in the embodiment, e.g., a mixed gas constituted of $C_5F_8$, $O_2$ and Ar is induced into the processing chamber 102 and vacuum drawing is implemented to sustain the atmosphere inside the processing chamber 102 at a specific level of reduced pressure, e.g., in a range of 45 mTorr~50 mTorr. During this process, the flow rate ratio of $C_5F_8$ and $O_2$ is set within the range of $1 \leq (C_5F_8$ flow rate/$O_2$ flow rate)<1.625 and, more desirably, within the range of $1.3 \leq (C_5F_8$ flow rate/$O_2$ flow rate)$\leq 1.5$. In addition, a rotating magnetic field of 100 Gauss~200 Gauss is generated in the plasma area inside the processing chamber 102 by rotating the magnet 106. Next, when specific process conditions are achieved, a specific level of high-frequency power, e.g., 1500 W, with a specific frequency of, for instance, 13.56 MHz is applied from the high-frequency source 124 to the lower electrode 110 to cause a glow discharge to occur between the lower electrode 110 and the upper electrode 108. This dissociates the processing gas in the embodiment supplied into the processing chamber 102 to excite the plasma.

Since the processing gas in the embodiment is a mixed gas constituted of $C_5F_8$, $O_2$ and Ar, an atmosphere that is rich in carbon can be created inside the processing chamber 102 without having to add a carbon gas such as CO, and a carbon-containing film that is to constitute a protective film can be formed reliably at the inner wall surfaces of the contact holes 210. As a result, the CF (fluorocarbon) type radicals which are the etching seed, are not allowed to reach the SiNx film 206 readily. Thus, the SiNx film 206 is protected to improve the selection ratio. In addition, the contact holes 210 achieving the desired uniform shape are formed in the minute space between the gates 202. It is to be noted that a photoresist film 212, which is to be used as an etching mask, is formed on the $SiO_2$ film 208 in the figure.

Embodiments

Next, embodiments of the etching method according to the present invention are explained. It is to be noted that since the embodiments below were all implemented by employing the etching apparatus 100 in the embodiment described above with specific conditions such as the composition of the processing gas and the gas flow rates varied as explained below to form the contact holes 210 between the gates 202 formed at the wafer W, the same reference numbers are assigned to components having roughly identical functions and structural features to preclude the necessity for repeated explanation thereof.

(A) Contact Hole Taper Angle

Figure 3A:
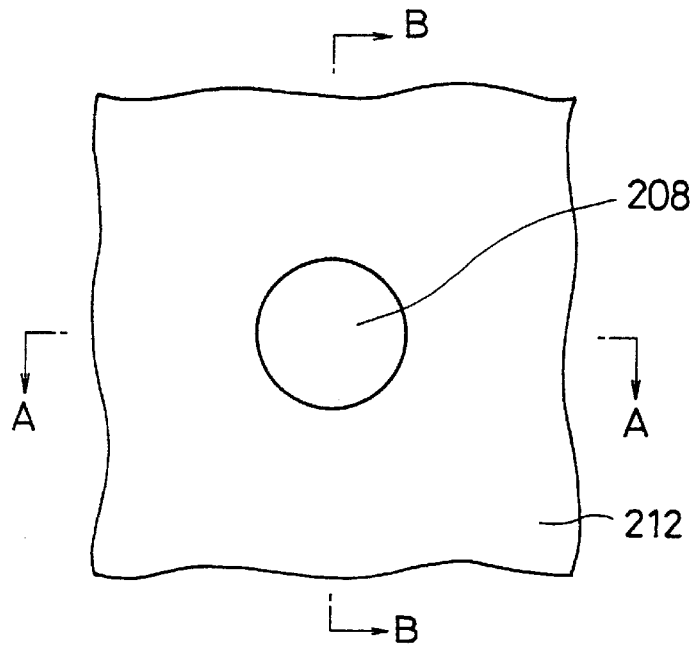
FIG. 3 schematically illustrates a wafer processed in embodiments of the present invention and in comparative examples from the prior art.
Figure 3B:
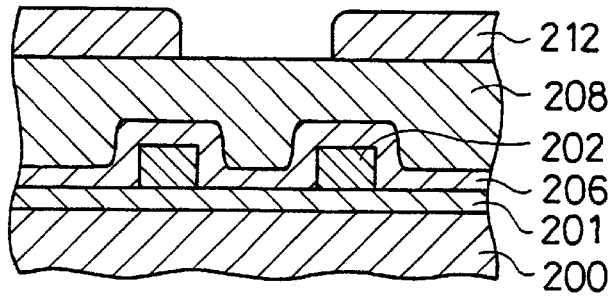
Figure 3C:
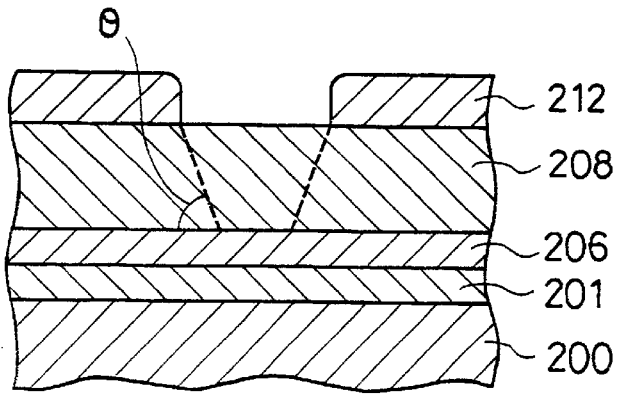

First, in reference to Table 1, the taper angle of the contact holes 210 is explained. It is to be noted that the term "taper angle" refers to the angle (theta) formed by a side surface of the $SiO_2$ film 208 inside a contact hole 210 and the upper surface of the SiNx film 206 shown in FIG. 3(c) and FIG. 4 when the $SiO_2$ film 208 is etched by using the photoresist film 212 having a specific pattern formed therein as a mask, as illustrated in FIG. 3(a) presenting a view of the area over which the contact hole 210 is formed, FIG. 3(b) presenting a sectional view through a plane along line A—A in FIG. 3(a) and FIG. 3(c) presenting a sectional view through a plane along line B—B in FIG. 3(a).

TABLE 1

| embodiment | processing gas flow rates (sccm) | | | $C_5F_8/O_2$ flow rate ratio | atmosphere pressure inside processing chamber (mTorr) | power (kW) | lower electrode temperature (°C.) | contact hole taper angle (°) |
|---|---|---|---|---|---|---|---|---|
| | $C_5F_8$ | $O_2$ | $A_r$ | | | | | |
| 1 | 6.5 | 4 | 400 | 1.625 | 50 | 1.5 | 40 | 86.9 |
| 2 | 6 | 4 | 400 | 1.5 | 50 | 1.5 | 40 | 87.5 |
| 3 | 6.5 | 5 | 400 | 1.3 | 50 | 1.5 | 40 | 87.9 |
| 4 | 6.5 | 4 | 400 | 1.625 | 50 | 1.4 | 40 | 87.2 |
| 5 | 6.5 | 4 | 400 | 1.625 | 50 | 1.6 | 40 | 87.4 |
| 6 | 6.5 | 4 | 400 | 1.625 | 45 | 1.5 | 40 | 87.0 |
| 7 | 6.5 | 4 | 400 | 1.625 | 50 | 1.5 | 20 | 86.4 |
| 8 | 3.25 | 2 | 200 | 1.625 | 50 | 1.5 | 40 | 87.1 |
| 9 | 9.75 | 6 | 600 | 1.625 | 50 | 1.5 | 40 | 87.5 |
| comparison example 1 | 18 ($C_4F_8$) | 300 (CO) | 380 | — | 40 | 1.5 | 40 | 86.3 |

The results presented in Table 1 were achieved by forming contact holes 210 at the $SiO_2$ film 208 under various etching conditions corresponding to embodiment 1~embodiment 9 and comparison example 1 listed in Table 1.

Figure 4:
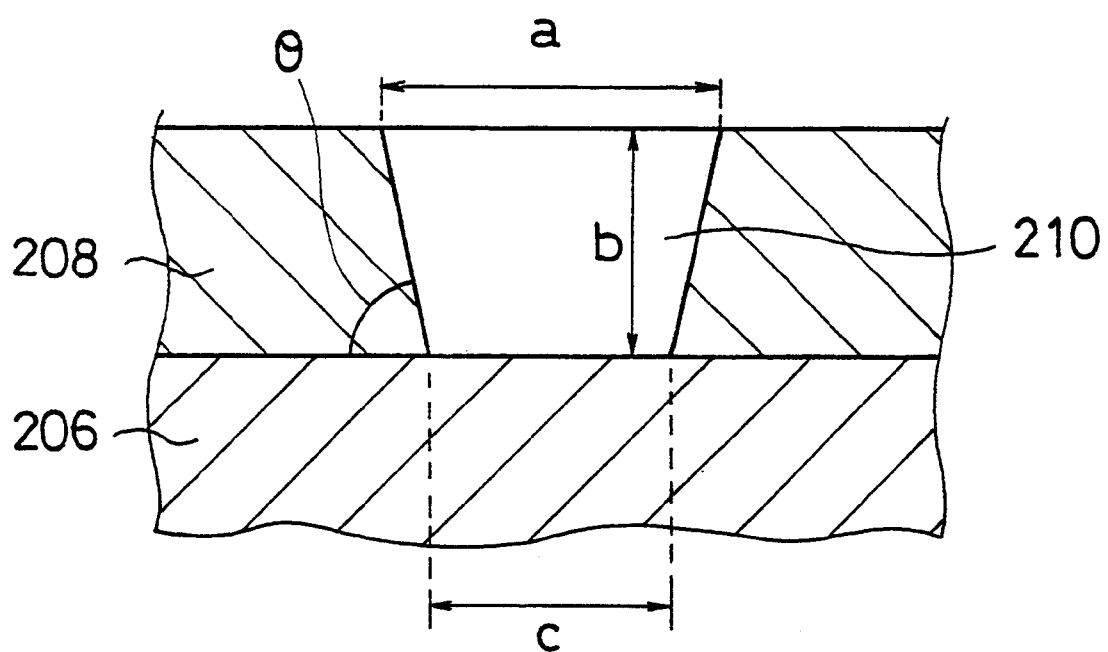
FIG. 4 schematically illustrates the taper angle of the contact hole.

Now, the difference between the shapes of the contact holes 210 formed through etching processes implemented using processing gasses constituted of $C_5F_8$, $O_2$ and Ar as described above and the shape of a contact hole resulting from an etching process implemented using the processing gas constituted of $C_4F_8$, CO and Ar in the prior art is explained by using a relational expression;

$$c=a-(2b)/\tan\theta \quad (1),$$

which expresses the relationship that the taper angle (theta) has with "a" representing the diameter of the upper portion of the contact hole 210 (hereafter referred to as the "etching diameter"), "b" representing the depth (height) of the contact hole 210 (hereafter referred to as the "etching film thickness") and "c" representing the diameter of the lower portion of the contact hole 210 (hereafter referred to as the "contact diameter") in FIG. 4.

Assuming that the etching process is implemented through ultra-fine machining with the etching diameter (a) at 0.25 μm and the etching film thickness (b) at 1.5 μm, the contact diameter "c" for the comparison example 1 is calculated to be 0.056 μm and the average contact diameter for embodiment 1~embodiment 9 is calculated to be 0.103 μm by substituting the taper angle (theta) in expression (1) above, with 86.3° for comparison example 1 with the average 87.2° for embodiment 1~embodiment 9 respectively. Using these results, the area ratio of the average bottom area of the contact hole 210 among the embodiments and the area of the contact hole 210 in the comparison example is calculated to be;

$$(0.103/0.056)^2=3.38.$$

Thus, only by changing the taper angle (theta) by as little as 0.9°, the area at the bottom of the contact hole 210 increases by as much as 3.38 times the bottom area in the prior art, to greatly contribute to a reduction in the contact resistance.

In addition, by setting the flow rate ratio of $C_5F_8$ and $O_2$ within the range of $1.3 \leq (C_5F_8$ flow rate/$O_2$ flow rate$) \leq 1.625$, setting the atmosphere pressure within the processing chamber 102 to 45 mTorr~50 mTorr and setting the temperature of the lower electrode 110 within the range of 20° C.~40° C. as indicated in Table 1, the taper angle (theta) is increased compared to that achieved by using the processing gas in the prior art.

(B) Selection Ratio

Next, the selection ratio is explained in reference to Table 2.

TABLE 2

| embodiment | processing gas flow rates (sccm) | | | $C_5F_8/O_2$ flow rate ratio | atmosphere pressure inside processing chamber (mTorr) | power (kW) | lower electrode temperature (°C.) | $SiO_2$ film/ SiNx film selection ratio |
|---|---|---|---|---|---|---|---|---|
| | $C_5F_8$ | $O_2$ | $A_r$ | | | | | |
| 10 | 6 | 4 | 380 | 1.5 | 40 | 1.5 | 40 | 16.8 |
| 11 | 6 | 4 | 500 | 1.5 | 40 | 1.5 | 40 | 16.8 |
| 12 | 6 | 4 | 600 | 1.5 | 40 | 1.5 | 40 | 14.7 |
| 13 | 3 | 2 | 190 | 1.5 | 40 | 1.5 | 40 | 10.8 |
| 14 | 6 | 4 | 380 | 1.5 | 30 | 1.5 | 40 | 13.1 |
| 15 | 6 | 6 | 500 | 1 | 40 | 1.5 | 40 | 13.3 |
| comparison example 2 | 18 ($C_4F_8$) | 300 (CO) | 380 | — | 40 | 1.5 | 40 | 11.2 |

The results presented in Table 2 were achieved by forming contact holes 210 at the SiO$_2$ film 208 under various etching conditions corresponding to embodiment 10~embodiment 15 and comparison example 2 listed in Table 2. By performing the etching process using a processing gas containing C$_5$F$_8$ and O$_2$ with a flow rate ratio of C$_5$F$_8$ and O$_2$ set within the range of 1≦(C$_5$F$_8$ flow rate/O$_2$ flow rate)≦1.5 as indicated in the table, a selection ratio that is comparable to or better than that achieved in the etching process implemented by using the processing gas of the prior art constituted of C$_4$F$_8$, CO and Ar is achieved.

It is to be noted that the results presented in Table 3 were achieved in embodiment 16~embodiment 19 implemented by using processing gasses constituted of C$_5$F$_8$, CO and Ar.

TABLE 3

| embodiment | processing gas flow rates (sccm) | | | atmosphere pressure inside processing chamber (mTorr) | power (kW) | lower electrode temperature (° C.) | SiO$_2$ film/ SiNx film selection ratio |
|---|---|---|---|---|---|---|---|
| | C$_5$F$_8$ | CO | A$_r$ | | | | |
| 16 | 6 | 300 | 380 | 40 | 1.5 | 40 | 9.6 |
| 17 | 9 | 300 | 380 | 40 | 1.5 | 40 | 23.1 |
| 18 | 6 | 150 | 380 | 40 | 1.5 | 40 | 11.4 |
| 19 | 6 | 150 | 600 | 40 | 1.5 | 40 | 12.0 |

While the invention has been particularly shown and described with respect to preferred embodiments thereof by referring to the attached drawings, the present invention is not limited to these examples and it will be understood by those skilled in the art that various changes in form and detail may be made therein without departing from the spirit, scope and teaching of the invention.

According to the present invention, in which an etching process is implemented by using a gas containing C$_5$F$_8$ that is degraded in a relatively short period of time in the atmosphere, a contribution is made toward the prevention of global warming since C$_5$F$_8$ does not induce the greenhouse effect even when it is directly released into the atmosphere without becoming degraded during the process. In addition, since O$_2$ is added to the processing gas, an etch stop is prevented, and an etching shape that is almost vertical is attained. Furthermore, the process can be implemented at a high selection ratio.

INDUSTRIAL APPLICABILITY

The present invention may be adopted in an etching method, and, more specifically, in an-etching method in which an SiO$_2$ film is formed at a workpiece placed within an airtight processing chamber by raising a processing gas induced into the processing chamber to plasma.

What is claimed is:

1. An etching method comprising:
   placing a workpiece inside an airtight processing chamber, wherein a SiNx film is formed at the workpiece and a SiO$_2$ film is formed on the SiNx film;
   introducing a processing gas into the processing chamber, the processing gas comprising at least C$_5$F$_8$ and O$_2$, but substantially no CO; and
   selectively etching the SiO$_2$ film relative to the SiNx film by raising the processing gas to plasma.

2. An etching method according to claim 1, wherein the flow rate ratio for the C$_5$F$_8$ and the O$_2$ is set within the range of 1≦(flow rate of the C$_5$F$_8$/flow rate of the O$_2$)≦1.5.

3. An etching method according to claim 1, wherein the pressure within the processing chamber is set to 45 mTorr~50 mTorr.

4. An etching method according to claim 1, wherein the temperature of a stage on which the workpiece is mounted is set within the range of 20° C.~40° C.

5. An etching method according to claim 1, wherein the processing gas further contains an inert gas.

6. An etching method according to claim 1, wherein the inert gas is Ar.

7. An etching method comprising:
   placing a workpiece inside an airtight processing chamber, wherein a SiNx film is formed at the workpiece and a SiO$_2$ film is formed on the SiNx film;
   introducing a processing gas into the processing chamber, the processing gas consisting essentially of C$_5$F$_8$, O$_2$, and an inert gas; and
   selectively etching the SiO$_2$ film relative to the SiNx film by raising the processing gas to plasma.

8. An etching method according to claim 7, wherein the flow rate ratio for the C$_5$F$_8$ and the O$_2$ is set within the range of 1≦(flow rate of the C$_5$F$_8$/flow rate of the O$_2$)≦1.5.

9. An etching method according to claim 7, wherein the pressure within the processing chamber is set to 45 mTorr~50 mTorr.

10. An etching method according to claim 7, wherein the temperature of a stage on which the workpiece is mounted is set within the range of 20° C.~40° C.

* * * * *

UNITED STATES PATENT AND TRADEMARK OFFICE
CERTIFICATE OF CORRECTION

PATENT NO.    : 6,602,435 B1
DATED         : August 5, 2003.
INVENTOR(S)   : Masahiro Yamada et al.

It is certified that error appears in the above-identified patent and that said Letters Patent is hereby corrected as shown below:

Title page,
Item [75], Inventors, "Kawasaki (JP);" should read -- Kanagawa-ken (JP); --.

Column 8,
Line 44, "claim 1," should read -- claim 5, --.

Signed and Sealed this

Eleventh Day of November, 2003

JAMES E. ROGAN
*Director of the United States Patent and Trademark Office*